United States Patent
Roy (10) Patent No.: US 7,433,396 B2
(45) Date of Patent: Oct. 7, 2008

(54) METHODS AND APPARATUS FOR EQUALIZATION IN SINGLE-ENDED CHIP-TO-CHIP COMMUNICATION

(75) Inventor: Aninda Roy, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1543 days.

(21) Appl. No.: 10/112,302

(22) Filed: Mar. 28, 2002

(65) Prior Publication Data

US 2004/0198267 A1 Oct. 7, 2004

(51) Int. Cl.
*H03K 5/159* (2006.01)
(52) U.S. Cl. ...................................... 375/229
(58) Field of Classification Search ................. 375/219, 375/229, 257, 259, 230, 231, 232, 233, 234, 375/235, 236; 327/333, 334, 530; 307/15; 324/714; 363/62
See application file for complete search history.

(56) References Cited

U.S. PATENT DOCUMENTS

| | | | | |
|---|---|---|---|---|
| 4,425,548 A | * | 1/1984 | Kage | 327/166 |
| 6,130,842 A | * | 10/2000 | Lacey et al. | 365/185.24 |
| 6,215,816 B1 | * | 4/2001 | Gillespie et al. | 375/219 |
| 6,735,160 B1 | * | 5/2004 | Miyashita et al. | 369/59.12 |

* cited by examiner

*Primary Examiner*—Sam K Ahn
(74) *Attorney, Agent, or Firm*—Dorsey & Whitney LLP (57) ABSTRACT

Disclosed are novel methods and apparatus for efficiently providing equalization in single-ended chip-to-chip communication. In an embodiment, a method of adjusting signal levels to provide improved communication between a sender device and a receiver device is disclosed. The method includes providing a plurality of voltage dividers. The plurality of voltage dividers may be coupled to each other to provide a reference voltage to the receiver device. The method further includes providing a storage device to store previously received data by the receiver device and providing a controller to selectively activate the plurality of voltage dividers.

24 Claims, 5 Drawing Sheets

METHODS AND APPARATUS FOR EQUALIZATION IN SINGLE-ENDED CHIP-TO-CHIP COMMUNICATION

FIELD OF INVENTION

The present invention generally relates to the field of communication. More specifically, an embodiment of the present invention provides a technique for equalization in single-ended chip-to-chip wireline communication.

BACKGROUND OF INVENTION

Chip-to-chip wireline communication consists of a chip sending and receiving data from another chip over wires incorporated on a board on which the communicating chips are placed. The sending chip drives the data onto the wire, otherwise known as a board trace, using a driver circuit. The receiving chip receives the data at the other end of the communication bus using a receiver circuit. The unit of data transferred may be called a bit. A chip may use a single wire to send data, wherein the communication method is called single-ended signaling, or it may use a pair of wires to send data, wherein the communication method is called differential signaling.

In single-ended signaling, a bit is driven onto a board trace at a particular voltage level. In binary communication, where data is coded as a series of 1's and 0's, a 1 could be any voltage above a particular value, while a 0 could be any voltage below a certain value. The driver, therefore, when driving a 1, places a voltage step on the board trace. The performance of the complete communication system is a factor of the edge-rate and the voltage level that the driver drives onto the board trace. Generally, a faster edge-rate and a higher voltage level result in a higher performance system. In single-ended signaling, the receiving chip compares the voltage of the bit sent down the board trace against an internally generated reference voltage to resolve the identity of the bit. For example, in binary communication, the receiver resolves a bit to be a 1 if the voltage it receives is above the reference voltage, and a 0 if the voltage is below the reference voltage. A voltage step may be referred to as being composed of a set of sine waves having different frequencies. The edge rate of the voltage step can be a function of the set of frequencies, e.g., with higher frequencies resulting in a faster edge-rate.

High-speed single-ended signaling over relatively long board traces suffers from a number of important problems. The first problem is inter-symbol interference (ISI), where because of the high-speed nature of the signaling, the driver switches before the previous bit completely attains its direct current (DC) level, thereby attaining voltage levels on succeeding bits as a function of the previous bits. For example, if a driver has driven a 1 and then a 0, the voltage level attained by the 0 will be lower than the voltage level attained if the driver had driven two 1's followed by the 0. The second problem is low-pass characteristics of board traces that connect chips together, where the higher frequency components of a voltage step suffer greater losses than lower frequency components. Therefore, the edge-rate that a driver drives onto the bus degrades as it travels through a board trace. Third, the DC resistance of the long board trace also causes a voltage level loss of the edge that the driver drives onto the board trace.

Equalization is a technique that seeks to mitigate these three problems in wireline communication. The most common equalization scheme consists of drive-side pre-emphasis or zero-forcing schemes, where the driver drives a faster edge when it senses that it has driven a series of bits of the same value. Driver-side equalization, however, suffers from increased driver-caused switching noise on the driver power supply, thereby diminishing the performance achieved by this scheme. Traditional receiver-side equalization techniques, such as minimum-mean-square equalization or decision-feedback equalization schemes, require the use of analog filters and therefore are difficult to implement in a complementary metal oxide semiconductor (CMOS) device.

Figure 1:
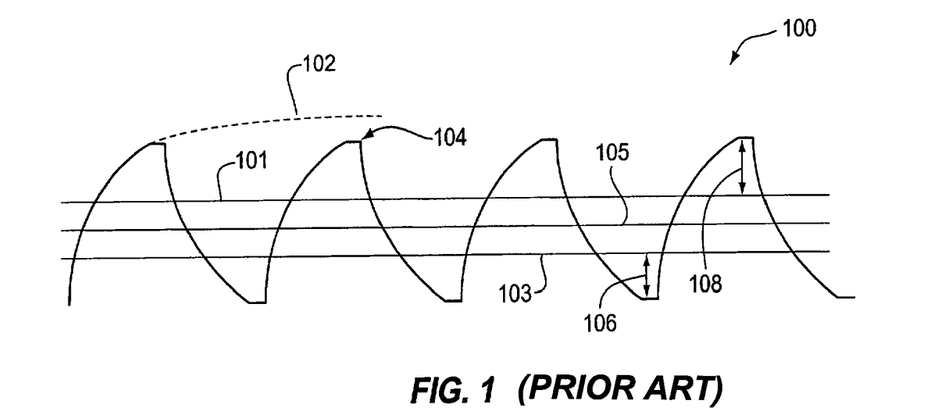
FIG. 1 illustrates a voltage waveform 100 in accordance with the prior art.

FIG. 1 illustrates a voltage waveform 100 in accordance with the prior art. The voltage waveform 100 can be received at a receiver pin when the data pattern is a "nominal" repeating pattern of 1010101. The receiver senses a high at 101, a low at 103, and a reference voltage at 105. As can be seen in FIG. 1, the speed of the signaling results in a bit time that is smaller than the time required for the voltage waveform to reach its steady-state value at 102 (i.e., the waveform 100 must transition at a point 104 because of the small bit time). In other words, the bit time of the signaling requires that the waveform transition before the voltage can settle to its steady-state value. The difference between the voltage received at the receiver pin for a 1 and the voltage that the receiver can recognize as a 1 is the voltage margin for the low to high transition (106). Similarly, the voltage margin for a high to low transition is shown at 108. Smaller voltage margins (106 and 108) result in higher bit error rate of the signaling interface, resulting in a lower performance interface.

Figure 2:
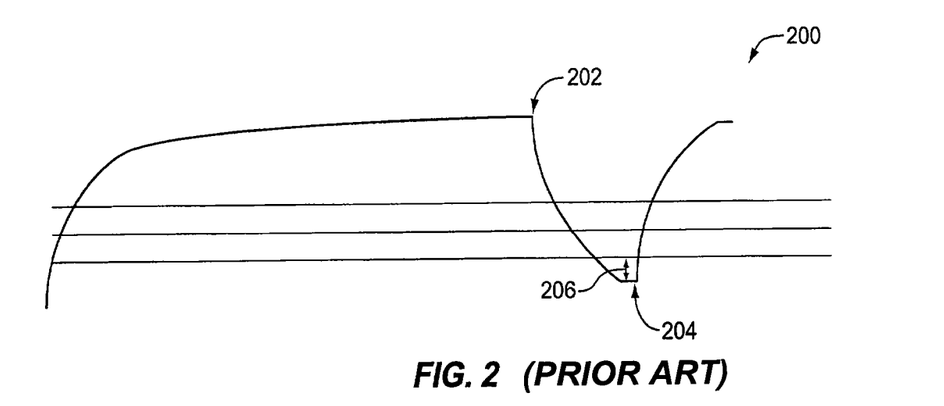
FIG. 2 illustrates another voltage waveform (200) in accordance with the prior art.

FIG. 2 illustrates another voltage waveform (200) in accordance with the prior art. The voltage waveform 200 can be received at a receiver pin when the data pattern is 111101111 (i.e., there is a "lonely" 0 in the pattern). In FIG. 2, the voltage at the receiver pin has relatively more time to reach its steady-state value (204) and hence climbs to a "high" voltage that is higher than when the nominal pattern of alternating 0's and 1's is transmitted (such as in FIG. 1). When the "lonely" 0 is transmitted, the voltage of the signal line (204) does not go down to the level it went down to when the nominal data pattern was transmitted (such as in FIG. 1). This is because the high to low transition started at a voltage higher than in the nominal case. Thus, the voltage margin for the high to low transition (206) for a "lonely" 0 is diminished compared to the case of FIG. 1.

Figure 3:
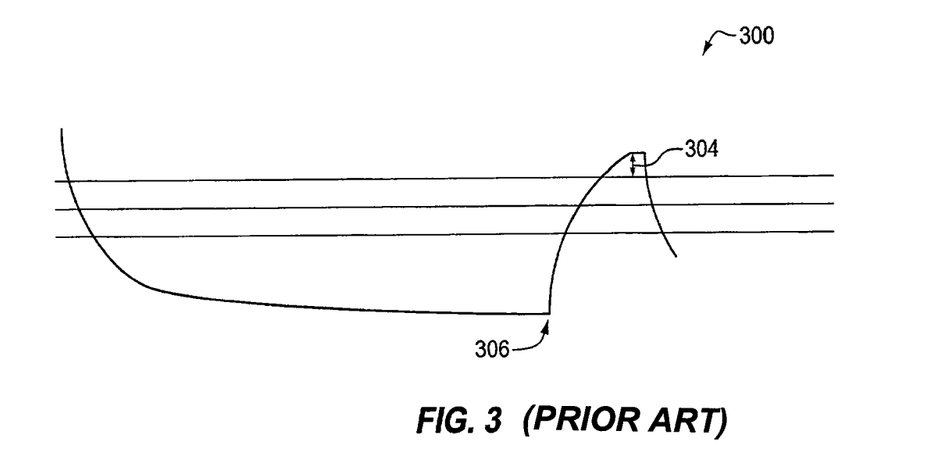
FIG. 3 illustrates a different voltage waveform (300) in accordance with the prior art.

FIG. 3 illustrates a different voltage waveform (300) in accordance with the prior art. The voltage waveform 300 can be received at a receiver when a data pattern of the type 0001000 (i.e., containing a "lonely" 1) is transmitted. Here, the voltage margin for the low to high transition (304) is diminished when a waveform 300 transitions at a lower "low" value (306).

SUMMARY OF INVENTION

The present invention includes novel methods and apparatus to provide for equalization in single-ended chip-to-chip communication. In an embodiment, a method of adjusting signal levels to provide improved communication between a sender device and a receiver device is disclosed. The method includes providing a plurality of voltage dividers. The plurality of voltage dividers may be coupled to each other to provide a reference voltage to the receiver device. The method further includes providing a storage device to store previously received data by the receiver device and providing a controller to selectively activate the plurality of voltage dividers. It is envisioned in an embodiment that the reference voltage may be adjusted based on the stored previously received data.

In another embodiment, the adjustment of the reference voltage may improve a diminished voltage margin present during transmission of lonely 0's.

In a different embodiment, the adjustment of the reference voltage may improve a diminished voltage margin present during transmission of lonely 1's.

In a further embodiment, the reference voltage may be adjusted relatively higher when the stored previously received data includes a series of 1's.

In yet another embodiment, the reference voltage may be adjusted relatively lower when the stored previously received data includes a series of 0's.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art that embodiments of the invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

Figure 4:
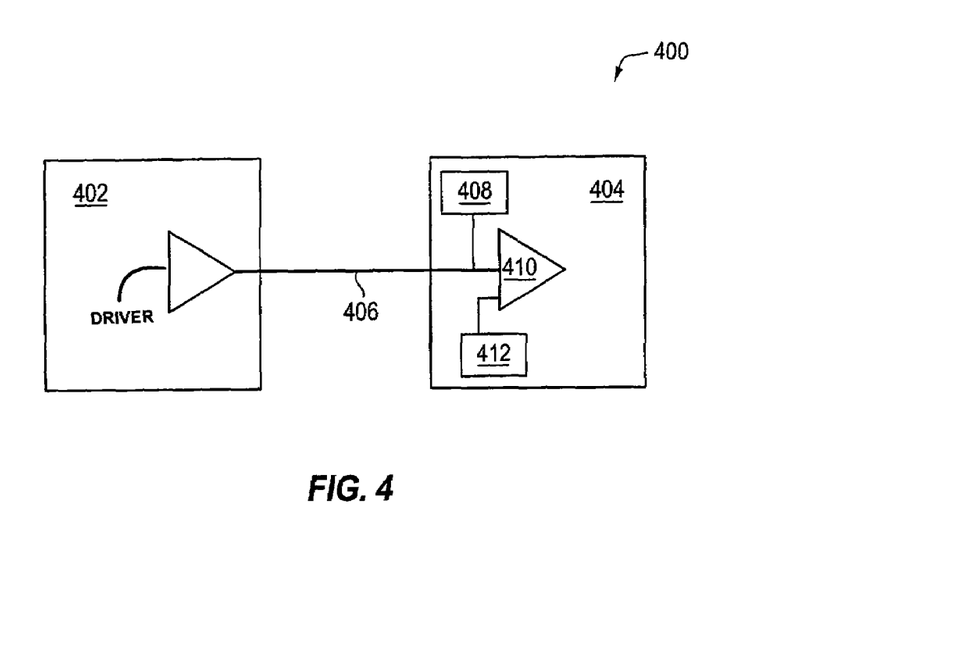
FIG. 4 illustrates an exemplary chip-to-chip communication system 400 in accordance with an embodiment of the present invention.

FIG. 4 illustrates an exemplary chip-to-chip communication system 400 in accordance with an embodiment of the present invention. The communication system 400 includes a driver chip 402 and a receiver chip 404. In an embodiment, the driver chip 402 and receiver chip 404 are connected together with a single signal trace 406 in a single-ended signaling scheme. As can be seen, the receiver chip may include a termination circuit 408. In one embodiment, it is envisioned that the termination circuit 408 may match the termination at its input pin to that of the signal trace 406. Such an embodiment can ensure that there are no signal reflections to degrade signal transmissions on, for example, the signal trace 406. In an embodiment, each bit of data can be sent on the signal trace 406 by, for example, charging the signal trace 406 to a "high" voltage for a 1 and a "low" voltage for a 0.

A receiver circuit 410 may be utilized by the receiver chip 404 to capture the data received and compare the voltage associated with the received data at its input pin against an internally generated voltage reference signal. This voltage reference signal may be generated by a reference-voltage-generation circuit 412. In an embodiment, such as that illustrated in FIG. 4, both the receiver circuit 410 and the reference-voltage-generation circuit 412 may be implemented within the receiver chip 404.

Figure 5:
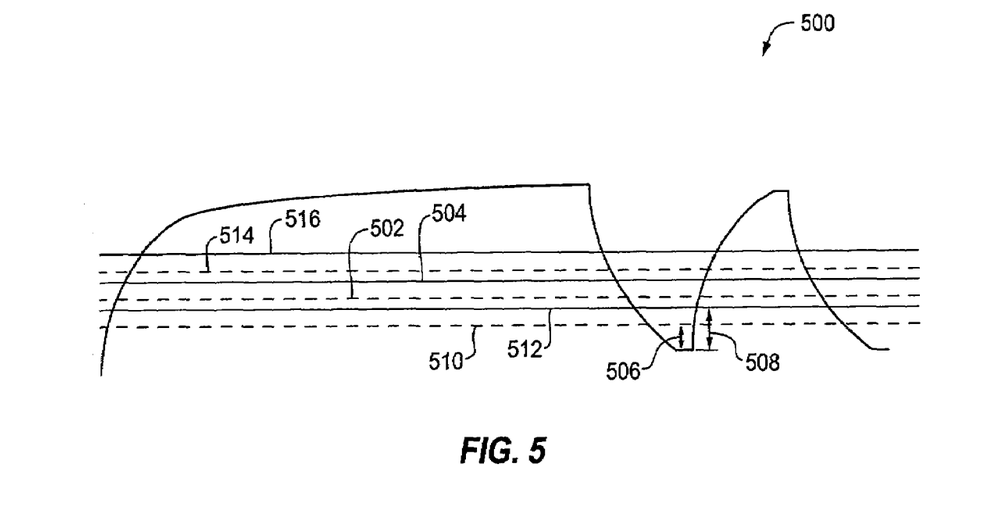
FIG. 5 illustrates an exemplary waveform 500 in accordance with an embodiment of the present invention.

FIG. 5 illustrates an exemplary waveform 500 in accordance with an embodiment of the present invention. The waveform 500 illustrates a case for a data pattern with a "lonely" 0 (e.g., 111101111). As illustrated in FIG. 5, a reference voltage has been adjusted from an original voltage level 502 to an improved voltage level 504. As a result, the voltage margin has been improved from an original level 506 to an improved level 508. In an embodiment, the receiver low sense voltage and high sense voltage can also be modified from 510 to 512 and from 514 to 516, respectively. It is also envisioned, in accordance with one embodiment of the present invention, that for a "lonely" 1 data pattern (e.g., 000010000) a similar adjustment (but downward instead of the upward adjustment discussed with respect to FIG. 5) may be made to the respective reference, low sense, and high sense voltages to improve the voltage margins associated with the "lonely" 1 data pattern.

Figure 6:
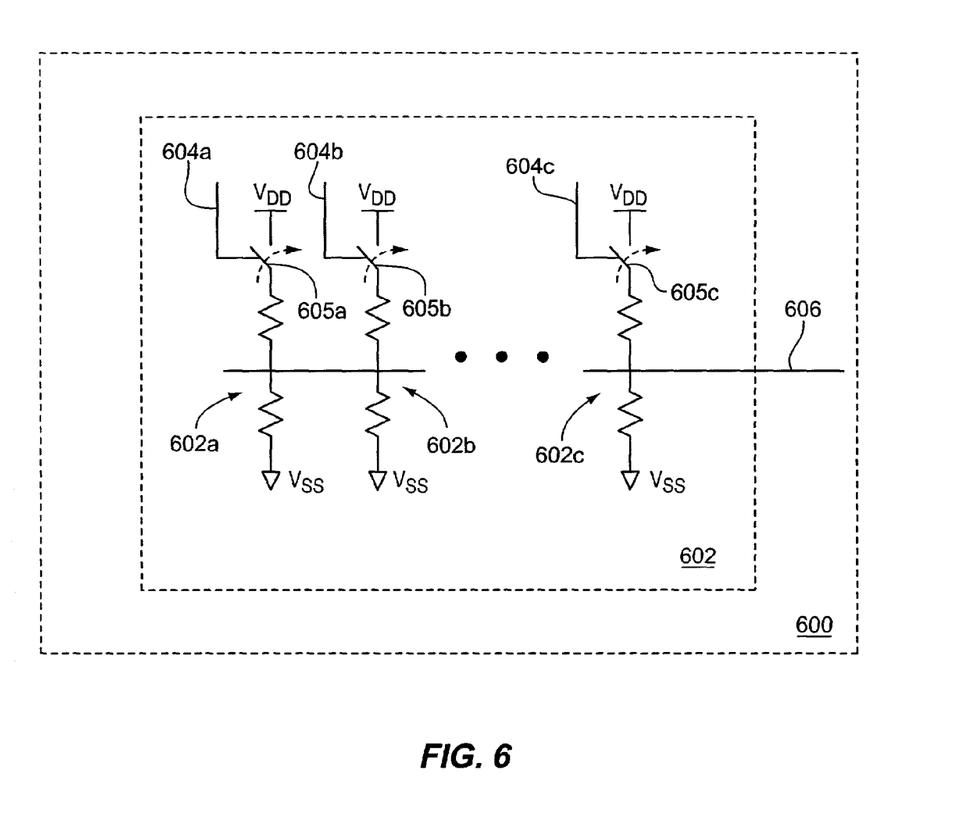
FIG. 6 illustrates an exemplary block diagram of a nominal reference-voltage-generator 600 in accordance with an embodiment of the present invention.

FIG. 6 illustrates an exemplary block diagram of a nominal reference-voltage-generator 600 in accordance with an embodiment of the present invention. As can be seen, the reference-voltage-generator 600 may be composed of a series of voltage dividers (e.g., 602a-c) with, for example, pull down and pull up resistors. Each voltage divider may in turn be activated or deactivated based on signals provided at nodes 604a-c, respectively (to, for example, a transistor and/or switch 605a-c). In an embodiment, a particular voltage divider can be selected and turned on with an appropriate digital code during, for example, the start-up phase of the reference-voltage-generator 600. The reference-voltage-generator 600 may provide its reference voltage output on a line 606.

Figure 7:
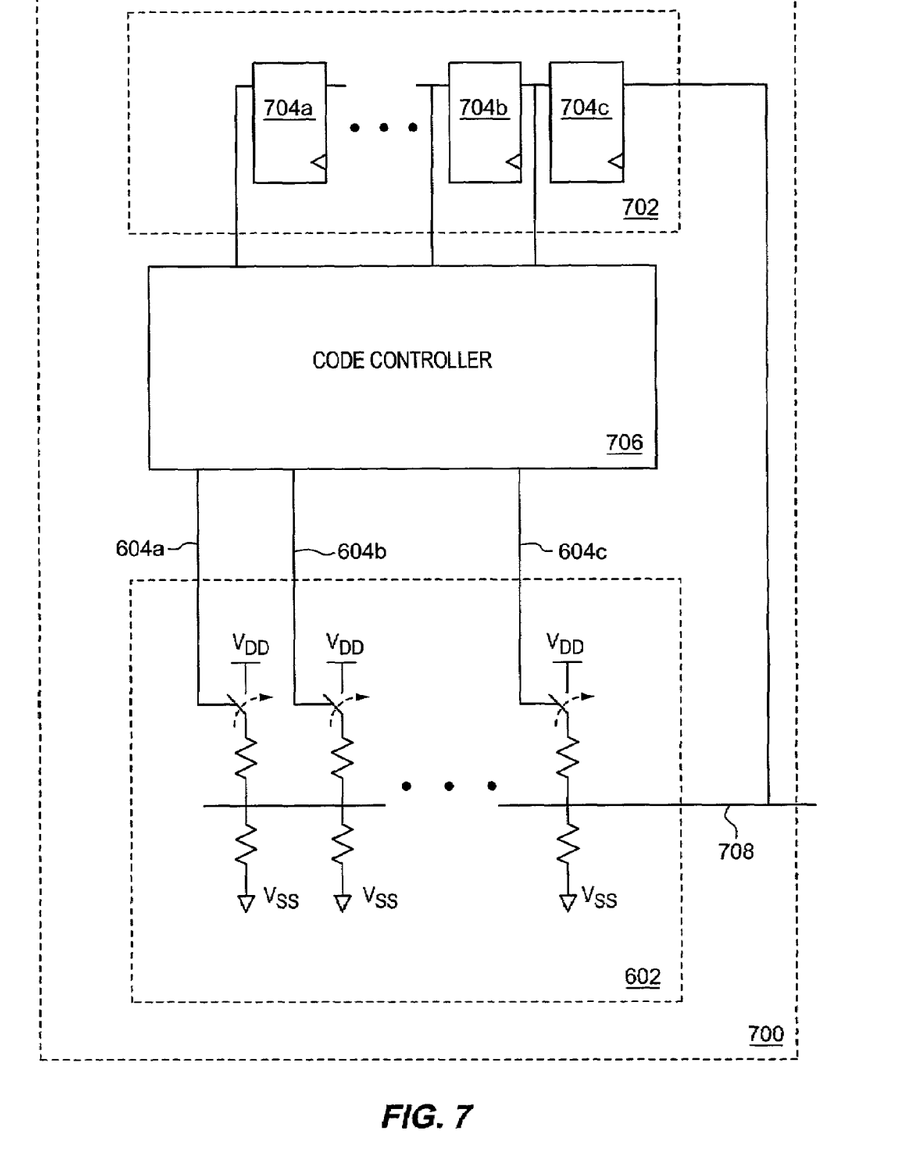
FIG. 7 illustrates an exemplary block diagram of a reference-voltage generator 700 in accordance with an embodiment of the present invention.

FIG. 7 illustrates an exemplary block diagram of a reference-voltage generator 700 in accordance with an embodiment of the present invention. The reference-voltage-generator 700 may include the series of voltage dividers 602 (such as those discussed with respect to FIG. 6). The reference-voltage-generator 700 also includes a history buffer 702 that may store the previously received bits. In an embodiment, the history buffer 702 can be a first-in first-out (FIFO) buffer including, for example, a series of flip-flops connected in series (704a-c). It is envisioned that the history buffer 702 may include as many FIFOs as necessary to store the received bits. The reference-voltage-generator 700 can also include a code controller 706. In an embodiment, the code controller 706 may utilize the contents of the history buffer 702 to adjust the codes being fed into the series of voltage dividers 602 (for example at nodes 604a-c). The reference-voltage-generator 700 may provide its reference voltage output on a line 708.

Figure 8:
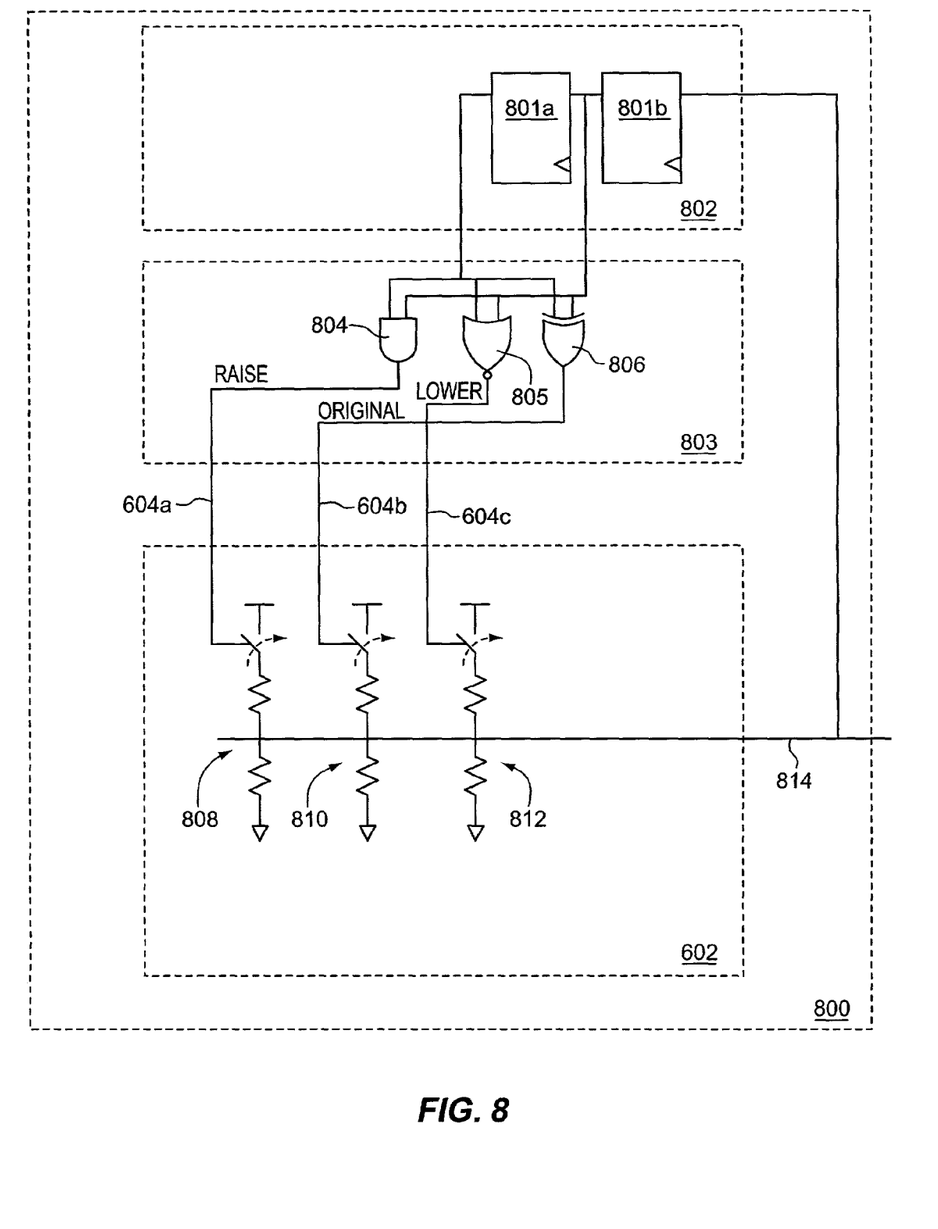
FIG. 8 illustrates an exemplary block diagram of a reference-voltage generator 800 in accordance with an embodiment of the present invention.

FIG. 8 illustrates an exemplary block diagram of a reference-voltage generator 800 in accordance with an embodiment of the present invention. The reference-voltage-generator 800 may include the series of voltage dividers 602 (such as those discussed with respect to FIG. 6). The reference-voltage-generator 800 further includes a history buffer 802 (similar in an embodiment to the history buffer 702) with a 2-bit FIFO (e.g., 801*a-b*), for example, storing the previous two bits received. The reference-voltage-generator 800 also includes a code controller 803 (which, in an embodiment, may be similar to the code controller 706 of FIG. 7). The code controller 803 includes an AND gate 804, a NOR gate 805, and a XOR gate 806. Each of these gates receive their inputs from the history buffer 802 (e.g., 801*a-b*). The outputs of each of these gates (804, 805, and 806) are coupled to nodes 604*a*, 604*c*, and 604*b*, respectively. As illustrated in FIG. 8, the reference-voltage-generator 800 may provide its reference voltage output on a line 814.

In an embodiment, the respective outputs of gates 804-806 can: (a) switch on 808 if the last two received bits were both 1's (thereby raising the reference voltage); (b) switch on 810 nominally (if the last two received bits were either but not both 1's or 0's, i.e., 10 and/or 01); and/or (c) switch on 812 if the last two bits received are 0's (thereby lowering the reference voltage). Therefore, in an embodiment, the series of voltage dividers 602 includes three voltage dividers (e.g., 808-812), with one voltage divider (810) generating the nominal reference voltage, a second voltage divider (808) generating a higher reference voltage relative to the nominal reference voltage, and a third voltage divider (812) producing a lower reference voltage relative to the nominal reference voltage. Those with ordinary skill in the art would understand that the voltage dividers (e.g., 808, 810, and/or 812) may be implemented in numerous ways and utilized in various embodiments of the present invention with the attainment of all or some of the advantages. Also, in one embodiment, it is envisioned that different types of voltage dividers may be utilized at the same time.

Accordingly, an embodiment of the present invention seeks to correct the diminished voltage margins for lonely 0's and 1's by enhancing the functionality of the reference-voltage-generation circuit (e.g., 412 of FIG. 4). This embodiment may adjust the reference voltage of the reference-voltage-generation circuit 412 to improve the diminished voltage margins obtained during the transmission of "lonely" 0's and 1's. In one embodiment, the reference voltage value is increased when a series of 1's is detected at the receiving pin and the reference voltage value is decreased when a series of 0's are detected at the receiving pin.

The foregoing description has been directed to specific embodiments. It will be apparent to those with ordinary skill in the art that modifications may be made to the described embodiments, with the attainment of all or some of the advantages. For example, the techniques of the present invention may be implemented in any communication system employing a single-ended design. Also, in an embodiment, the present invention provides a receiver-side equalization technique that is relatively easy to implement in traditional CMOS devices. Therefore, it is the object of the appended claims to cover all such variations and modifications as come within the spirit and scope of the invention.

What is claimed is:

1. A method of adjusting signal levels to provide improved communication between a sender device and a receiver device, the method comprising:

providing a plurality of voltage dividers, the plurality of voltage dividers coupled to each other to provide a reference voltage to the receiver device;

providing a storage device to store a data pattern comprising at least two data bits of the same value transmitted from the sender device to the receiver device; and providing a controller to selectively activate the plurality of voltage dividers, wherein the controller receives the data pattern from the storage device; and wherein the reference voltage is adjusted based on the stored data pattern comprising at least two data bits of the same value transmitted from the sender device.

2. The method of claim 1 wherein the adjustment of the reference voltage improves a diminished voltage margin present during transmission of lonely 0's.

3. The method of claim 1 wherein the adjustment of the reference voltage improves a diminished voltage margin present during transmission of lonely 1's.

4. The method of claim 1 wherein 1's and wherein the reference voltage is adjusted relatively lower than a nominal value when the stored data pattern includes a series of 0's.

5. The method of claim 1 wherein when one voltage divider of the plurality of voltage dividers is activated other voltage dividers of the plurality of voltage dividers are deactivated.

6. The method of claim 1 wherein the controller; comprises an XOR gate, an AND gate and a NOR gate;

the plurality of voltage dividers includes a first voltage divider coupled to the XOR gate, a second voltage divider coupled to the AND gate and a third voltage divider coupled to the NOR gate;

wherein the XOR gate activates the first voltage divider when the stored data pattern includes a 1 and a 0 and the reference voltage is adjusted to a nominal value, the AND gate activates the second voltage divider when the stored data pattern includes at least two 1's and the reference voltage is adjusted relatively higher than a nominal value, and the NOR gate activates the third voltage divider when the stored data pattern includes at least two 0's and the reference voltage is adjusted relatively lower than a nominal value.

7. The method of claim 1 wherein the storage device is implemented within the receiver device.

8. The method of claim 1 wherein the storage device includes a plurality of FIFOs.

9. The method of claim 1 wherein the plurality of voltage dividers include items selected from a group comprising a pull up resistor, a pull down resistor, and a transistor.

10. The method of claim 1 wherein the receiver device is a CMOS device.

11. The method of claim 1 wherein the sender device is a CMOS device.

12. An apparatus for adjusting signal levels to provide improved communication between a sender device and a receiver device, the apparatus comprising:

a plurality of voltage dividers, the plurality of voltage dividers coupled to each other to provide a reference voltage to the receiver device;

a storage device to store a data pattern comprising at least two data bits of the same value transmitted from the sender device to the receiver device; and a controller to selectively activate the plurality of voltage dividers, wherein the controller receives the data pattern from the storage device; and wherein the reference voltage is adjusted based on the stored data pattern comprising at least two data bits of the same value transmitted from the sender device.

13. The apparatus of claim 12 wherein the adjustment of the reference voltage improves a diminished voltage margin present during transmission of lonely 0's.

14. The apparatus of claim 12 wherein the adjustment of the reference voltage improves a diminished voltage margin present during transmission of lonely 1's.

15. The apparatus of claim 12 wherein the reference voltage is adjusted relatively higher than a nominal value when the data pattern includes a series of 1's and wherein the reference voltage is adjusted relatively lower than a nominal value when the data pattern includes a series of 0's.

16. The apparatus of claim 12 wherein when one voltage divider of the plurality of voltage dividers is activated other voltage dividers of the plurality of voltage dividers are deactivated.

17. The apparatus of claim 12 wherein the controller comprises an XOR gate, an AND gate and a NOR gate;
the plurality of voltage dividers includes a first voltage divider coupled to the XOR gate, a second voltage divider coupled to the AND gate and a third voltage divider coupled to the NOR gate;
wherein the XOR gate activates the first voltage divider when the stored data pattern includes a 1 and a 0 and the reference voltage is adjusted to a nominal value, the AND gate activates the second voltage divider when the stored data pattern includes at least two 1's and the reference voltage is adjusted relatively higher than a nominal value, and the NOR gate activates the third voltage divider when the stored data pattern includes at least two 0's and the reference voltage is adjusted relatively lower than a nominal value.

18. The apparatus of claim 12 wherein the storage device is implemented within the receiver device.

19. The apparatus of claim 12 wherein the storage device includes a plurality of FIFOs.

20. The apparatus of claim 12 wherein the plurality of voltage dividers include items selected from a group comprising a pull up resistor, a pull down resistor, and a transistor.

21. The apparatus of claim 12 wherein the receiver device is a CMOS device.

22. The apparatus of claim 12 wherein the sender device is a CMOS device.

23. An apparatus comprising:
communication means to provide communication between a sending means and a receiving means;
voltage dividing means to provide a reference voltage to the receiving means;
storage means to store a data pattern comprising at least two data bits of the same value transmitted from the sender device to the receiving means; and
controller means to receive the data pattern from the storage means and selectively activate a plurality of voltage dividers within the voltage dividing means to adjust the reference voltage based on the data pattern.

24. The apparatus of claim 23 wherein the storage means is implemented within the receiving means.

* * * * *

UNITED STATES PATENT AND TRADEMARK OFFICE
CERTIFICATE OF CORRECTION

PATENT NO.        : 7,433,396 B2
APPLICATION NO.   : 10/112302
DATED             : October 7, 2008
INVENTOR(S)       : Aninda Roy It is certified that error appears in the above-identified patent and that said Letters Patent is hereby corrected as shown below:

In column 6, at line 16, after "The method of claim 1 wherein" insert --the reference voltage is adjusted relatively higher than a nominal value when the stored data pattern includes a series of--.

Signed and Sealed this

Eighteenth Day of November, 2008

JON W. DUDAS
*Director of the United States Patent and Trademark Office*